United States Patent
Tseng et al.

(10) Patent No.: US 6,174,376 B1
(45) Date of Patent: Jan. 16, 2001

(54) APPARATUS FOR EVACUATING A PROCESS CHAMBER

(75) Inventors: Heng-Yi Tseng, Hsin-Chu; Chang-Ray Chen, Chu-bay; Maw-Sheng Juang; Kuei-Chang Ho, both of Hsin-chu, all of (TW)

(73) Assignee: Taiwan Semiconductor Manufacturing Co., Ltd, Hsin Chu (TW)

( * ) Notice: Under 35 U.S.C. 154(b), the term of this patent shall be extended for 0 days.

(21) Appl. No.: 09/323,365

(22) Filed: Jun. 1, 1999

(51) Int. Cl.[7] .................................................. C23C 16/00
(52) U.S. Cl. .......................................... 118/715; 137/630.1
(58) Field of Search ............................ 118/715; 137/629, 137/630.1

(56) References Cited

U.S. PATENT DOCUMENTS

| | | | |
|---|---|---|---|
| 4,432,250 | * 2/1984 | Albrecht et al. | 73/864.34 |
| 5,575,853 | * 11/1996 | Arami et al. | 118/708 |
| 5,607,511 | * 3/1997 | Meyerson | 118/725 |
| 5,653,807 | * 8/1997 | Crumbaker | 118/715 |
| 5,819,683 | * 10/1998 | Ikeda et al. | 118/724 |
| 5,958,510 | * 9/1999 | Sivaramakrishnam et al. | 427/255.6 |
| 6,015,463 | * 1/2000 | Cox | 118/715 |

* cited by examiner

*Primary Examiner*—Gregory Mills
*Assistant Examiner*—Sylvia R MacArthur
(74) *Attorney, Agent, or Firm*—Tung & Associates

(57) ABSTRACT

An apparatus and a method for evacuating a process chamber by a dry pump and then shutting down the pump without back steam and high pressure safety problems are disclosed. In the apparatus, a conduit is provided for connecting in fluid communication between a process chamber and a dry pump, two gate valves are provided in the conduit with one mounted adjacent to the process chamber and the other adjacent to the dry pump. A pressure relief valve is provided and mounted to bridge over an inlet and an outlet of the second gate valve such that any pressure build-up in the conduit upstream of the second gate valve can be avoided for preventing injury to a machine operator. The back steam problem can be effectively prevented when the dry pump is shut down simultaneously with the closing of the first and the second gate valves. The pressure relief valve may be pre-set to operate automatically when a differential pressure larger than 0.33 psi is detected. The apparatus is further provided with a manual venting valve installed in the section of the conduit between the two gate valves such that the conduit may be manually vented to the atmosphere when the pressure relief valve malfunctions and fails to automatically vent.

10 Claims, 1 Drawing Sheet

APPARATUS FOR EVACUATING A PROCESS CHAMBER

FIELD OF THE INVENTION

The present invention generally relates to an apparatus for evacuating a process chamber and a method for using the apparatus and more particularly, relates to an apparatus for shutting down a dry pump in a vacuum system for a process chamber without back steam and high pressure safety problems and a method for operating the apparatus.

BACKGROUND OF THE INVENTION

Chemical vapor deposition (CVD) method has been used in the deposition of silicon dioxide films onto semi-conducting substrates. In the method, a gas containing the structural elements of the film material to be formed is fed into a chamber, followed by heating the gas to induce a chemical reaction to deposit the desired film on the semi-conducting substrate. In a conventional CVD method, a silicon dioxide film is frequently deposited by a reaction between silane and oxygen. The method enables the formation of a silicon dioxide film at a relatively low temperature.

In the fabrication of an advanced semiconductor device that requires a steep step coverage by a silicon dioxide film, the conventional CVD method of deposition by silane and other reactant gases was found to be inadequate, i.e., presenting a step coverage problem. In order to solve the step coverage problem, other methods have been developed. One of such methods is the utilization of a reactant of tetra-ethoxy-ortho-silicate (TEOS) which has better coverage characteristics than silane, although TEOS must be processed at a high reaction temperature due to its low reactivity.

In the high temperature processing of TEOS, the pyrolysis of TEOS for obtaining an oxide film is similar to the decomposition process of silane in forming polysilicon. A carrier gas, typically an inert gas such as nitrogen, can be used to bubble through liquid TEOS to provide a gas mixture of controlled TEOS partial pressure in the reaction chamber. Since TEOS consists of a silicon atom that is symmetrically bonded to four $OC_2H_5$ groups, the decomposition of TEOS at a high temperature, i.e., between 650° C. and 750° C. results in silicon dioxide and by-products of organic and organosilicon compounds. For instance, the pyrolysis reaction of TEOS can be represented by:

$$Si(C_2H_5O)_4 \rightarrow SiO_2 + \text{by-products}$$

The deposition rate of $SiO_2$ depends on the TEOS partial pressure presented in the reaction chamber and the reaction temperature. Oxide films may also be produced by reacting TEOS with oxygen at low pressure and high temperature, i.e., between 650~750° C. The reaction produces $SiO_2$, $CO_2$ and $H_2O$. The TEOS oxide films produced by the LPCVD method exhibit excellent uniformity and step coverage. However, the high decomposition temperature of TEOS precludes its usage for depositing oxide layers over pre-formed structures that are high temperature sensitive, such as structures formed of aluminum or metal silicides.

In a low pressure TEOS oxide deposition process, the deposition chamber or the chemical vapor deposition chamber must first be evacuated to a very low pressure. For instance, the low pressure between about 1 Pa and about 120 Pa. The evacuation of the chemical vapor deposition chamber is carried out by an electrical dry pump. The conduit that connects between the process chamber and the dry pump and provides fluid communication therein between is controlled by a gate valve for opening or closing the conduit. The gate valve is positioned at a location juxtaposed or neighboring to the process chamber. In such a conventional set up, the conduit, which is frequently a 4-inch diameter stainless steel pipe, is frequently coated with a layer of reaction by-product on its inner wall. The reaction by-product is formed of hydrocarbon chemistry and exists in a white powdery form. Its exact composition varies and is difficult to determine by routine chemical analysis.

The dry pump used to evacuate the deposition chamber is frequently mounted at a floor level substantially below that of the process chamber and operates at the atmospheric pressure. The length of the conduit that connects the process chamber and the dry pump may be as long as 10~15 meters which presents ample opportunity for the reaction by-product to deposit on the inner wall when evacuated by the pump. The by-product also cumulates in the dry pump chamber and may even cause the pump to stop functioning due to jamming of the rotors. When jamming occurs, the dry pump stops completely. When the pump stops, the powdery deposit on the interior wall of the conduit and in the dry pump may be siphoned back into the process chamber due to a large pressure differential existed between the dry pump and the process chamber, i.e., at $10^5$ Pa vs. at $10^2$ Pa. Even though a gate valve is provided in the conduit and is suppose to stop the siphoning or the back steam (as commonly known in a fabrication plant), the gate valve itself may be contaminated by the by-product and thus fails to function properly to stop the siphoning of powder into the chamber. Since a large number of wafers are processed in a modern furnace, i.e., as many as 144 wafers can be processed in a vertical furnace, particle contamination in the furnace can be detrimental to the yield of the fabrication process. The contamination to a process chamber by such by-product must therefore be prevented.

It is therefore an object of the present invention to provide an apparatus for controlling a vacuum system in a process chamber that does not have the drawbacks or shortcomings of the conventional apparatus.

It is another object of the present invention to provide an apparatus for evacuating a process chamber that utilizes a gate valve and a T-shaped cold trap in a conduit connecting the process chamber and the dry pump.

It is a further object of the present invention to provide an apparatus for evacuating a process chamber wherein a gate valve is installed in a conduit providing fluid communication between the process chamber and the dry pump at a location juxtaposed to the process chamber.

It is another further object of the present invention to provide an apparatus for evacuating a process chamber wherein a gate valve and a T-shaped cold trap are installed in a conduit connecting between a process chamber and a dry pump such that the cold trap collects large contaminating particles.

It is still another object of the present invention to provide an apparatus for providing fluid communication between a process chamber and a dry pump with a first gate valve, a T-shaped cold trap and a second gate valve sequentially connected between the process chamber and the dry pump.

It is yet another object of the present invention to provide an apparatus for providing fluid communication between a process chamber and a dry pump wherein a first gate valve is installed in a conduit in close proximity to the process chamber, a second gate valve is installed in the conduit in close proximity to the dry pump and a pressure relief valve is installed bridging across the second gate valve to relieve any pressure build up in the conduit upstream of the second gate valve thus eliminating any high pressure safety problem.

It is still another further object of the present invention to provide a method for preventing chamber contamination by particles from a conduit or a pump by connecting a first gate valve in the conduit immediately adjacent to the process chamber, a second gate valve in the conduit immediately adjacent to the dry pump and a T-shaped cold trap between the first and the second gate valves.

It is yet another further object of the present invention to provide a method for preventing high pressure safety problems in a vacuum conduit system for a process chamber by connecting a first gate valve juxtaposed to the process chamber, a second gate valve juxtaposed to a dry pump and a pressure relief valve connected bridging the second gate valve such that a pressure built up before the second gate valve can be avoided.

SUMMARY OF THE INVENTION

In accordance with the present invention, an apparatus for evacuating a process chamber and a method for evacuating a process chamber by a dry pump without back steam and high pressure safety problems are disclosed.

In a preferred embodiment, an apparatus for evacuating a process chamber can be provided which includes a conduit for providing fluid communication between a process chamber and a dry pump, a first gate valve situated juxtaposed to the process chamber for opening and closing the conduit, the first gate valve defining a first conduit section between the first gate valve and the process chamber, a second gate valve situated juxtaposed to the dry pump for opening and closing the conduit, the second gate valve defining a second conduit section between the first and second gate valves, a third conduit section between the second gate valve and the dry pump, and a pressure relief valve bridging between the second conduit section and the third conduit section for relieving pressure when a pressure in the second conduit section is at least 0.2 psi higher than a pressure in the third conduit section.

The apparatus for evacuating a process chamber further includes a particle trap in fluid communication with the second conduit section for collecting contaminating particles. The apparatus may further include a pressure gauge for measuring pressure in the second conduit section. The apparatus may further include a purge gas inlet in the second conduit section for flowing a purge gas into the second conduit section when the dry pump is shut down. The apparatus may further include a purge gas inlet in the second conduit section for flowing an inert gas into the second conduit section to dilute residual process gas. The apparatus may further include a pressure relief valve for relieving pressure when a pressure in the second conduit section is at least 0.33 psi higher than a pressure in the third conduit section. The apparatus may further include a process controller for automatically opening the pressure relief valve when a pressure in the second conduit section is at least 0.2 psi higher than a pressure in the third conduit section. The process chamber may be a chemical vapor deposition chamber. The third conduit section in fluid communication with the dry pump may be vented to the atmosphere when the dry pump is shut down. The apparatus may further include a manual venting valve provided in the second conduit section for venting the section when the pressure relief valve fails.

The present invention is further directed to a method for evacuating a process chamber by a dry pump without back steam and high pressure safety problems which can be carried out by the operating steps of first connecting a process chamber and a dry pump in fluid communication by a conduit, connecting a first gate valve in the conduit juxtaposed to the process chamber defining a first conduit section between the first gate valve and the process chamber, connecting a second gate valve in the conduit juxtaposed to the dry pump defining a second conduit section between the first and second gate valves and a third conduit section between the second gate valve and the dry pump, connecting a pressure relief valve bridging between the second conduit section and the third conduit section, closing the first and second gate valves when shutting down the dry pump, and opening the pressure relief valve when a pressure in the second conduit section is at least 0.2 psi higher than a pressure in the third conduit section.

The method for evacuating a process chamber by a dry pump may further include the step of measuring a pressure in the second conduit section by a pressure gauge prior to the step of opening the pressure relief valve. The method may further include the step of providing a particle trap in fluid communication with the conduit section for collecting contaminating particles in the conduit. The method may further include the step of opening a pressure relief valve when a pressure in the second conduit section is at least 0.33 psi higher than a pressure in the third conduit section.

The method for evacuating a process chamber by a dry pump may further include the step of flowing a purge gas into the second conduit section to dilute any residual process gas in the conduit. The method may further include the step of providing a process chamber for a chemical vapor deposition process. The method may further include the step of venting the third conduit section to the atmosphere when the dry pump is shut down. The conduit section may be vented to the atmosphere by a manual venting valve when the pressure relief valve fails to operate.

In an alternate embodiment, a method for shutting down a vacuum system to a process chamber without back steam and high pressure safety problems can be carried out by the operating steps of connecting a process chamber and a dry pump in fluid communication by a conduit, connecting a first gate valve in the conduit immediately adjacent to the process chamber defining a first conduit section between the first gate valve and the process chamber, connecting a second gate valve in the conduit adjacent to the dry pump defining a second conduit section between the first and second gate valves and a third conduit section between the second gate valve and the dry pump, connecting a pressure relief valve bridging between the second conduit section and the third conduit section, shutting down the dry pump while simultaneously closing the second gate valve for preventing back steam, flowing a purge gas into the first and second conduit sections to dilute a process gas, opening the second gate valve for venting to the atmosphere through the dry pump after a time period of at least 15 minutes after the dry pump is shut down.

The method for shutting down a vacuum system to a process chamber without back steam and high pressure safety problems may further include the step of opening the second gate valve for venting to the atmosphere through the dry pump after a pressure gauge in the second conduit section indicates a pressure of at least 1 atm.

BRIEF DESCRIPTION OF THE DRAWINGS

These and other objects, features and advantages of the present invention will become apparent from the following detailed description and the appended drawings in which.

DETAILED DESCRIPTION OF THE PREFERRED AND ALTERNATE EMBODIMENTS

Figure 1:
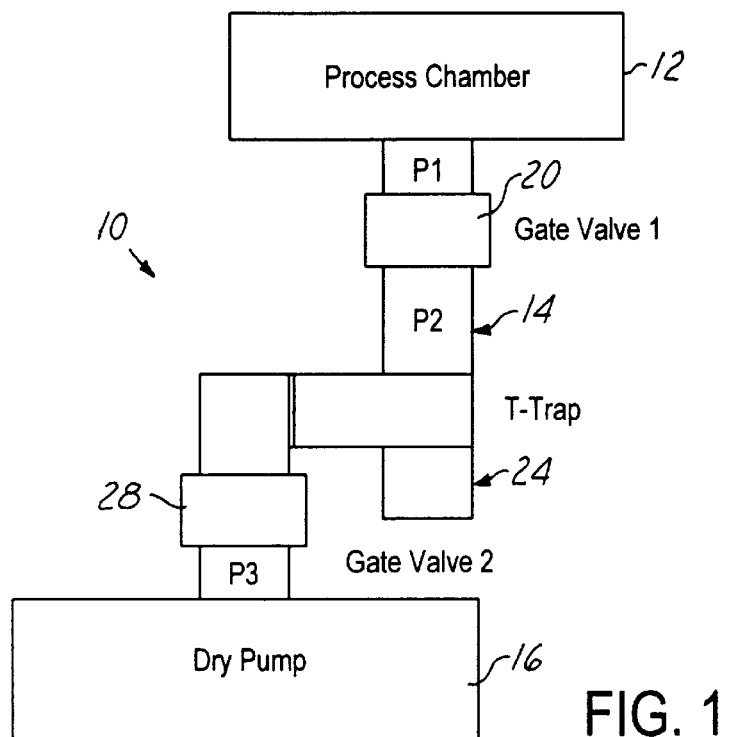
FIG. 1 is a graph illustrating an apparatus which has two gate valves and a T-trap installed in a conduit connecting a process chamber and a dry pump.

The present invention discloses an apparatus for evacuating a process chamber which is constructed by a pump, a first gate valve mounted in a conduit adjacent to the process chamber for opening and closing the conduit, the first gate valve defines a first conduit section between the valve and the process chamber. The apparatus further includes a second gate valve that is mounted adjacent to the dry pump for opening and closing the conduit, the second gate valve further defines a second conduit section between the first and second gate valves, and a third conduit section between the second gate valve and the dry pump. The present invention apparatus further includes a pressure relief valve which is mounted bridging between the second conduit section and the third conduit section for relieving pressure when a pressure in the second conduit section is at least 0.2 psi higher than a pressure in the third conduit section. The present invention further discloses a method for evacuating a process chamber by a dry pump without back steam and high pressure safety problems by first connecting a first gate valve and a second gate valve in a conduit between the process chamber and the dry pump adjacent to the chamber and to the pump, respectively, and then connecting a pressure relief valve bridging over the second gate valve such that any high pressure in the conduit upstream of the second gate valve can be released to the atmosphere through the dry pump when the dry pump is shut down for service or maintenance.

The present invention novel apparatus effectively prevents a siphoning, or back steam of contaminating particles generated as by-products in a TEOS oxide process into the process chamber to contaminate the wafers. The T-shaped cold trap effectively collects large contaminating particles, i.e., particles which have a diameter larger than 100 $\mu$m or which are larger than the size of a grain of rice. It has been found that contaminating particles of smaller sizes do not impede the proper operation of a dry pump. It has also been found that larger particles, i.e., those of 100 $\mu$m diameter or larger, do not overcome gravitational force once they have been collected at the bottom of the T-trap. By utilizing the present invention novel apparatus and method, the amount of the TEOS by-products collected in a cold trap during a monthly preventive maintenance procedure is approximately 300 gm.

It is desirable that the vacuum evacuation line for a pump should be as straight as possible in order to gain maximum pumping speed. The T-shaped cold trap utilized in the present invention only affects the pumping speed slightly and thus does not present a problem.

The present invention novel apparatus, as shown in an alternate embodiment, utilizes a second gate valve for controlling the passage between a process chamber and a dry pump. It was discovered that a single gate valve, without a T-shaped cold trap, cannot effectively prevent the back steam (or siphoning) of contaminating particles when a pump failure occurs. This is because a single gate valve may be coated or contaminated by a powdery coating of the by-products and therefore may no longer seal perfectly. The back steam, and the resulting contamination of wafers by the reaction by-products, must therefore be prevented from occurring in order to prevent a wafer yield problem.

In the present invention alternate embodiment, a second gate valve is installed in combination with a T-shaped cold trap at a location close to a dry pump while a first gate valve is installed close to a process chamber. The second gate valve does not have a sealing problem since the T-shaped cold trap effectively decreases the amount of the powdery by-products from reaching the second gate valve. When the present invention alternate embodiment is implemented, contaminating particles left in the pump must go through the second gate valve, the T-trap, the conduit line and the first gate valve in order to reach the process chamber. The contamination of the process chamber is therefore very unlikely. It has been observed, when the present invention alternate embodiment is installed in place, the contaminating particle count is drastically reduced from 1500 to 100 for 0.15 $\mu$m sized particles. This is a 15-fold decrease which clearly demonstrates the effectiveness of the present invention apparatus.

Referring initially to FIG. 1, wherein a simplified illustration of the present invention apparatus 10 is shown. The apparatus 10 consists of a process chamber 12 which is a low pressure chemical vapor deposition chamber for depositing TEOS oxide films. The process chamber 12 is connected to and in fluid communication with a dry pump 16 through conduit 14. The conduit 14 is normally constructed of a four-inch diameter stainless steel pipe. The conduit 14, as shown in FIG. 1, is controlled by a first gate valve 20 installed juxtaposed to the process chamber 12. By being juxtaposed to, it is meant a distance between about 5 cm and about 100 cm. The conduit 14 is then connected to a T-shaped cold trap 24 as shown in FIG. 1. A more detailed description of the T-trap will be given in a later section.

The gas evacuated from process chamber 12, after first deposited large contaminating particles in the T-trap 24, continuously flows through a second gate valve 28 into a dry pump 16. It should be noted that the second gate valve 28 is shown only in the alternate embodiment and is not absolutely necessary for the successful implementation of the present invention method. The second gate valve 28 should be installed juxtaposed to, or in close proximity of, the dry pump 16. By in close proximity of, it is meant that the second gate valve 28 should be installed at a distance to the dry pump 16 between about 5 cm and about 100 cm. It should be noted that the components shown in FIG. 1, and their relative positions installed are simplified to show a concept of the present invention apparatus. The scope of the present invention method and apparatus is therefore not limited by such illustration.

Figure 2:
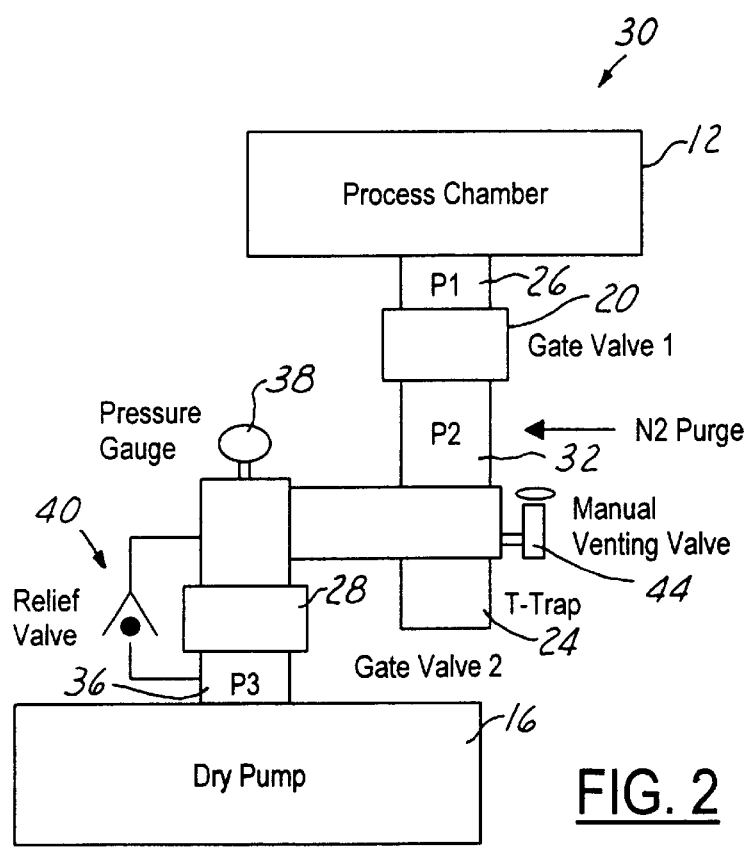
FIG. 2 is a graph illustrating the present invention apparatus including two gate valves, a T-trap and a pressure relief valve bridging over the second gate valve installed in a conduit connecting a process chamber and a dry pump.

A more preferred embodiment of the present invention apparatus 30 is shown in FIG. 2. In this embodiment, a pressure build-up in the second conduit 32 may be released before it poses a safety problem to the machine operator. It has been noticed that without the pressure relief valve 40, during a dry pump shut-down process, both the first gate valve 20 and the second gate valve 28 are closed for preventing back steam into the process chamber 12. During such shut-down procedure, an inert purge gas such as nitrogen is flown into the second conduit 32 for diluting any residual process gas may have been left behind. As a result, the internal pressure in the second conduit 32 is higher than the pressure in the first conduit 26 and in the third conduit 36. When a process technician attempts to disassemble any peripheral equipment connected to the second conduit 32, for instance, when a T-shaped cold trap 24 is removed for cleaning, the high internal pressure in the second conduit 32 may cause severe injury to the process technician. The present invention novel apparatus therefore provides a necessary solution to the problem by including a pressure relief valve 40 bridged across the second gate valve 28 connecting the second conduit 32 and third conduit 36.

The third conduit 36, in fluid communication with the dry pump which is vented to the atmosphere when shut-down, is also vented to the atmosphere. The pressure relief valve 40 may be pre-set at a pressure of about 0.2 psi, or preferably at a pressure of about 0.33 psi. The operation of the pressure relief valve 40 in an automated manner prevents a pressure build up in the second conduit 32 and eliminates any potential injury from occurring to a process technician. A pressure gauge 38 may further be provided in the second conduit 32 for providing a pressure read-out in the conduit.

In still another alternate embodiment, a manual venting valve 44 may be provided in the second conduit 32. The venting valve 44 is manually operated for venting the second conduit 32 to the atmosphere when a higher than 1 atm pressure is observed in the pressure gauge 38, or when the pressure relief valve 40 fails to automatically release the high pressure to the atmosphere through the third conduit 36 and the dry pump 16.

The present invention novel method may further be practiced without the pressure relief valve 40 in the following manner. When the dry pump 16 is shut-down and the first and second gate valves 20 and 28 are closed, an inert purge gas is first flown into the second conduit 32 for diluting any residual process gas that have been left in the conduit. The closing of the first and second gate valves 20, 28 effectively prevents a back steam into the process chamber 12 and thus eliminating any possibility of chamber contamination. To ensure the safety of the equipment operator, the second gate valve 28 may be pre-set to open automatically after a 15-minute time period, and preferably after a 20-minute time period. The second gate valve 28 may further be set to automatically open after a pressure gauge in the second conduit reads a pressure of at least 1 atm. This effectively vents the second conduit to the atmosphere and eliminates any possibility of injury to an equipment operator.

The present invention novel apparatus and method for evacuating a process chamber by a dry pump without back steam and high pressure safety problems have therefore been amply demonstrated in the above descriptions and in the appended drawings of FIGS. 1 and 2.

While the present invention has been described in an illustrative manner, it should be understood that the terminology used is intended to be in a nature of words of description rather than of limitation.

Furthermore, while the present invention has been described in terms of a preferred and two alternate embodiments, it is to be appreciated that those skilled in the art will readily apply these teachings to other possible variations of the inventions.

The embodiment of the invention in which an exclusive property or privilege is claimed are defined as follows:

1. An apparatus for evacuating a process chamber comprising:
   a conduit for providing fluid communication between a process chamber and a dry pump,
   a first gate valve positioned juxtaposed to said process chamber for opening and closing said conduit, said first gate valve defines a first conduit section between said first gate valve and said process chamber,
   a second gate valve positioned juxtaposed to said dry pump for opening and closing said conduit, said second gate valve defines a second conduit section between said first and second gate valves and a third conduit section between said second gate valve and said dry pump, and
   a pressure relief valve bridging over said second conduit section and said third conduit section for relieving pressure when a pressure in said second conduit section is at least 0.2 psi higher than a pressure in said third conduit section.

2. An apparatus for evacuating a process chamber according to claim 1 further comprising a particle trap in fluid communication with said second conduit section for collecting contaminating particles.

3. An apparatus for evacuating a process chamber according to claim 1 further comprising a pressure gauge for measuring pressure in said second conduit section.

4. An apparatus for evacuating a process chamber according to claim 1 further comprising a purge gas inlet in said second conduit section for flowing a purge gas into said second conduit section when said dry pump is shut down.

5. An apparatus for evacuating a process chamber according to claim 1 further comprising a purge gas inlet in said second conduit section for flowing an inert gas into said second conduit section to dilute residual process gas.

6. An apparatus for evacuating a process chamber according to claim 1 further comprising a pressure relief valve for relieving pressure when a pressure in said second conduit section is at least 0.33 psi higher than a pressure in said third conduit section.

7. An apparatus for evacuating a process chamber according to claim 1 further comprising a process controller for automatically opening said pressure relief valve when a pressure in said second conduit section is at least 0.2 psi higher than a pressure in said third conduit section.

8. An apparatus for evacuating a process chamber according to claim 1, wherein said process chamber is a chemical vapor deposition chamber.

9. An apparatus for evacuating a process chamber according to claim 1, wherein said third conduit section in fluid communication with said dry pump is vented to the atmosphere when said dry pump is shut down.

10. An apparatus for evacuating a process chamber according to claim 1 further comprising a manual venting valve provided in said second conduit section.

* * * * *